United States Patent
Mitchell et al.

(10) Patent No.: US 9,406,621 B2
(45) Date of Patent: Aug. 2, 2016

(54) ULTRAVIOLET ENERGY SHIELD FOR NON-VOLATILE CHARGE STORAGE MEMORY

(75) Inventors: Allan T. Mitchell, Heath, TX (US); Keith Jarreau, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 303 days.

(21) Appl. No.: 12/797,971

(22) Filed: Jun. 10, 2010

(65) Prior Publication Data

US 2011/0303959 A1 Dec. 15, 2011

(51) Int. Cl.
 *H01L 23/552* (2006.01)
 *H01L 23/522* (2006.01)
 *B81B 7/00* (2006.01)
 *H01L 29/786* (2006.01)
 *H01L 27/115* (2006.01)

(52) U.S. Cl.
 CPC .......... *H01L 23/552* (2013.01); *B81B 7/0064* (2013.01); *H01L 23/5225* (2013.01); *H01L 29/78633* (2013.01); *H01L 27/11517* (2013.01); *H01L 2225/06537* (2013.01); *H01L 2924/0002* (2013.01); *H01L 2924/3025* (2013.01)

(58) Field of Classification Search
 None
 See application file for complete search history.

(56) References Cited

U.S. PATENT DOCUMENTS

| | | | |
|---|---|---|---|
| 4,519,050 A | 5/1985 | Folmsbee | |
| 4,758,984 A | 7/1988 | Yoshida | |
| 4,805,138 A | 2/1989 | McElroy et al. | |
| 4,970,565 A | 11/1990 | Wu et al. | |
| 5,034,786 A | 7/1991 | Eitan | |
| 5,050,123 A | 9/1991 | Castro | |
| 5,086,410 A * | 2/1992 | Bergemont | 365/185.04 |
| 5,235,541 A | 8/1993 | Edme et al. | |
| 5,440,510 A | 8/1995 | Caprara et al. | |
| 5,525,827 A | 6/1996 | Norman | |
| 6,028,335 A * | 2/2000 | Okamoto et al. | 257/314 |
| 7,344,987 B2 | 3/2008 | Leng et al. | |
| 2001/0012225 A1* | 8/2001 | Rhodes | 365/200 |
| 2002/0123221 A1* | 9/2002 | Jost et al. | 438/680 |
| 2006/0255398 A1* | 11/2006 | Roizin et al. | 257/324 |
| 2007/0126028 A1* | 6/2007 | Higashitani | 257/208 |
| 2007/0262422 A1* | 11/2007 | Bakalski et al. | 257/659 |
| 2009/0184386 A1* | 7/2009 | Kobayashi et al. | 257/435 |
| 2009/0295979 A1* | 12/2009 | Matsuo et al. | 348/335 |

FOREIGN PATENT DOCUMENTS

JP   2003-124363 A  *  4/2003

* cited by examiner

*Primary Examiner* — Fei Fei Yeung Lopez
(74) *Attorney, Agent, or Firm* — Rose Alyssa Keagy; Frank D. Cimino

(57) ABSTRACT

An integrated circuit with non-volatile memory cells shielded from ultraviolet light by a shielding structure compatible with chemical-mechanical processing. The disclosed shielding structure includes a roof structure with sides; along each side are spaced-apart contact posts, each with a width on the order of the wavelength of ultraviolet light to be shielded, and spaced apart by a distance that is also on the order of the wavelength of ultraviolet light to be shielded. The contact posts may be provided in multiple rows, and extending to a diffused region or to a polysilicon ring or both. The multiple rows may be aligned with one another or staggered relative to one another.

19 Claims, 15 Drawing Sheets

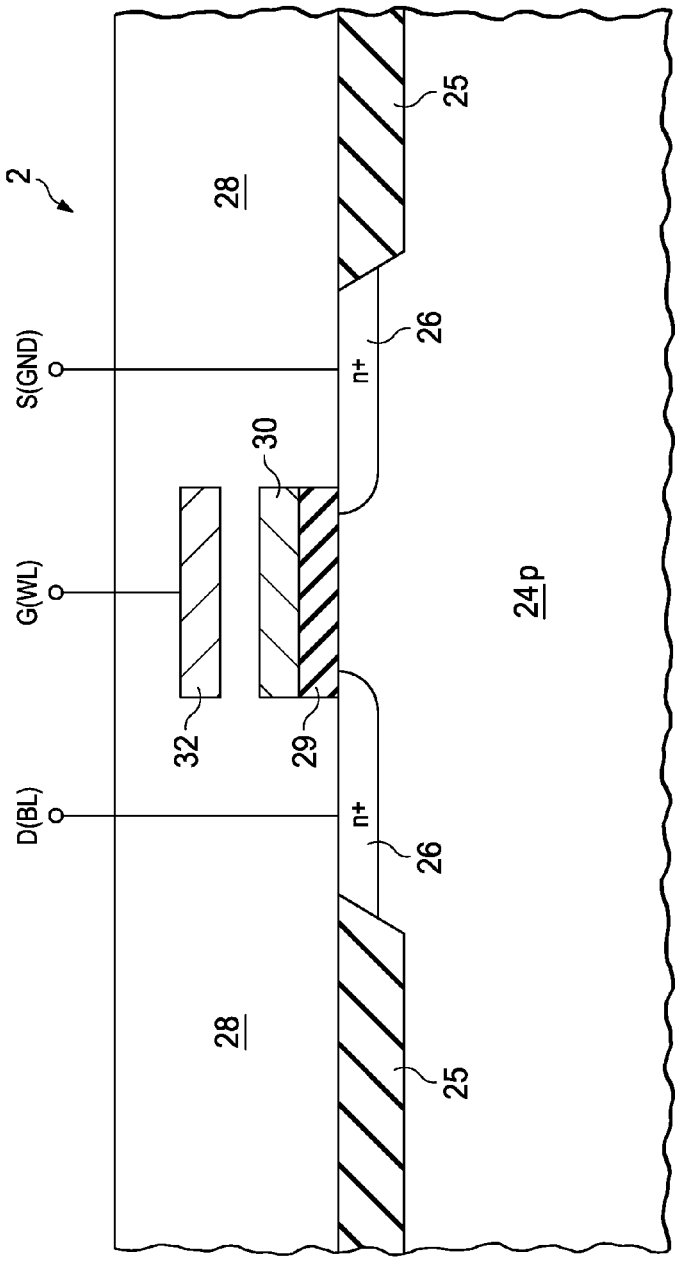
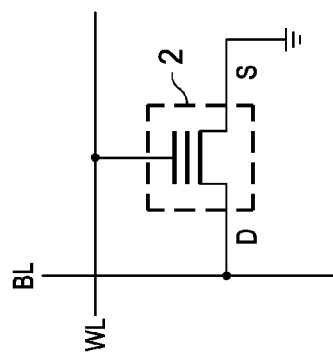
FIG. 2a
FIG. 2b

ULTRAVIOLET ENERGY SHIELD FOR NON-VOLATILE CHARGE STORAGE MEMORY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of nonvolatile semiconductor memory. Embodiments of this invention are more specifically directed to non-volatile memory elements of the charge storage type, and that are erasable by ultraviolet light.

Non-volatile solid-state read/write memory devices are now commonplace in many electronic systems, particularly in portable electronic devices and systems. A common technology for realizing non-volatile solid-state memory devices utilizes "floating-gate" transistors to store the data state. In general, trapped electrons on the floating gate raise the apparent threshold voltage of the memory cell transistor (for n-channel devices), as compared with its threshold voltage with no electrons trapped on the floating gate. The stored state can be read by sensing the presence or absence of source-drain conduction under bias.

Because of its convenience and efficiency, modern semiconductor non-volatile memories are now often embedded within larger scale integrated circuits, such as those including modern complex microprocessors, microcontrollers, digital signal processors, and other large-scale logic circuitry. Such embedded non-volatile memory is especially well-suited for use as program memory storing software routines executable by the processor, as well as for use as non-volatile data storage.

As well known in the art, one class of EPROM memory is referred to as UV-erasable EPROM memory, in that the contents of the memory are erasable by exposure to ultraviolet light (i.e., electromagnetic energy, or radiation, that is at ultraviolet wavelengths). According to conventional technology, the memory cell transistor in an EPROM is "programmed" by biasing it so that high energy electrons are injected through a thin dielectric film onto an electrically isolated transistor gate element. A more recent class of memories are referred to as EEPROM (electrically erasable programmable read-only memory), in that the memory cell transistors can be biased to selectively add or remove electrons from the floating gate, by way of a high voltage Fowler-Nordheim tunneling mechanism through a thin gate dielectric. Some EEPROM memory devices are of the "flash" type, in that a large number (a "block") of memory cells can be simultaneously erased in a single electrical operation. While EEPROMs are electrically erased (and thus typically housed in opaque device packages), EEPROM cells are also erasable by exposure to ultraviolet light in the same manner as UV EPROMs, even though UV light exposure will not be the erasure mechanism in actual system use. Another type of non-volatile electrically-programmable memory is referred to as "one-time programmable" ("OTP") memories, which can be programmed once, but is not erasable. For example, one type of OTP memory is a UV-erasable EPROM (i.e., not electrically erasable) packaged in an opaque package.

In certain applications, it is essential that programmed non-volatile memory elements not be erased. For example, some semiconductor memory devices, either random access memory (RAM), EPROM, or EEPROM may include programmable EPROM (or EEPROM) memory cells that are used to enable and select "redundant" memory cells in the memory, replacing normal memory array cells that are found to be defective during a manufacturing test. Once programmed, it is of course important that those additional programmable cells not be erased, because the redundant replacement mapping would then be lost. Non-volatile memory cells may also be programmed during manufacture to implement cryptographic information within an integrated circuit, for example to program a "key" or other secret information. In this cryptographic application, conductor lines and circuitry may not be available to re-program the non-volatile cells, and as such erasure would render the circuit non-functional or no longer secure. Non-volatile memory cells may also be provided, in a wide array of integrated circuits, to allow programmable "trimming" of analog voltages and levels; such trimming may be performed during manufacture, in which case erasure of the trimming memory cells would cause device inaccuracy.

Unfortunately, exposure of integrated circuits to ultraviolet light cannot be avoided in many manufacturing processes. For example, some assembly (i.e., packaging) processes require the use of intense ultraviolet light; for example, ultraviolet light is used to release surface mount devices from embossed tape (i.e., "tape and reel") in system assembly. This ultraviolet light may fully erase the programmed state of one or more cells, or even if not fully erasing a programmed memory cell, may degrade the programmed state of a memory cell to an extent that the operating margin of the circuit is reduced.

In addition, a UV-erasable EPROM may include additional EPROM cells that are used to map particular memory addresses to redundant memory cells (i.e., to replace failed cells at those addresses). Those additional EPROM cells must be protected so that the UV exposure in a conventional erase operation does not also erase the programmed cells mapping that redundant cell association.

The use of an opaque structure within the integrated circuit itself to shield UV-erasable non-volatile memory cells from exposure to light is known in the art. Conventional shield structures protect the memory cells from incident light normal to the active surface, and also from light traveling in a direction that is largely parallel to the active surface. One example of a conventional shielding structure consists of a box-like structure formed of polysilicon or a metal conductor (e.g., aluminum) during the manufacture of the integrated circuit, and disposed over the EPROM cells to be shielded. Conventional UV-shielding structures in integrated circuits typically consist of an opaque "roof" directly overlying the shielded memory cells, in contact with a continuous wall extending around the sides of the shielded memory cells, generally contacting a continuous diffusion ring at the active surface. The walls of these structures are typically formed by way of a continuous contact opening, etched through one or more layers of insulator material (e.g., silicon dioxide) in which a conductive material is deposited to contact diffused regions at the active surface. Openings in the walls of these conventional solid-wall shielding structures are required to allow conductors to pass through. As such, various approaches such as serpentine or labyrinth-like shapes for these conductive opaque shield structures are known.

Chemical-mechanical polishing ("CMP") is now commonly used in the manufacture of modern complex integrated circuits, as a technique for planarizing the top surface of integrated circuits during manufacture. Such planarization prior to metal deposition has proven useful in avoiding the risk of step coverage failure due to metal conductors running over severe device topology. Planarization prior to metal deposition also facilitates routing of multi-level metal conductors because each metal level is largely constrained in the vertical dimension.

However, it has been observed that conventional UV-shielding structures cannot be reliably formed in process flows that include CMP planarization. In particular, the long continuous contacts and vias required for the solid walls of conventional shielding structures are incompatible with CMP, because of the vulnerability of those structures to "dishing" (i.e., the unintended forming of concave features in metal features within the contact opening). Such dishing can result in a void between an overlying deposited conductor layer and the material filling the contact opening. Excessive formation of particle contaminants has also been observed to be caused by CMP of structures with such long continuous contacts; such particle contaminants in fact corresponding to the material that is dished out from the metal structures. As a result, design rules limiting the length of metal contact openings are now commonly enforced in integrated circuits that are fabricated by process flows including CMP. These design rules are of course incompatible with the formation of conventional UV shield structures with solid metal walls.

BRIEF SUMMARY OF THE INVENTION

Embodiments of this invention provide an integrated circuit device including non-volatile memory elements that are shielded from UV light by structures with discontinuous features.

Embodiments of this invention provide such a device that is compatible with fabrication by process flows including chemical-mechanical polishing.

Embodiments of this invention provide such a device that is compatible with contact design rules for active elements of the integrated circuit being formed.

Other objects and advantages of this invention will be apparent to those of ordinary skill in the art having reference to the following specification together with its drawings.

The present invention may be implemented into an integrated circuit including non-volatile memory elements, such as floating-gate transistors, and a method of fabricating the same. A conductive plate overlies one or more memory elements that are to be shielded from ultraviolet energy. Conductive contact posts extend from the conductive plate to a lower conductive region, for example to a diffused ring surrounding the shielded memory elements. The conductive contact posts have widths that are on the order of the wavelength of light to be blocked, and are spaced apart from one another by a distance that is also on the order of the wavelength of light to be blocked. Multiple rows of contact posts, and contacts to different overlying conductive layers, can be included.

The shield structure of embodiments of this invention blocks incident ultraviolet light from reaching the memory elements by way of the overlying opaque plate, and by way of the conductive contact posts to the plate. Incident light traveling along the surface is reflected by the conductive contact posts themselves, and is attenuated by interference among the spaces between the conductive contact posts. The structure is compatible with chemical-mechanical polishing (CMP) planarization.

BRIEF DESCRIPTION OF THE SEVERAL VIEWS OF THE DRAWING

FIG. 2a is an electrical diagram, in schematic form, of a non-volatile memory cell in the integrated circuit of FIG. 1.

FIG. 2b is a cross-sectional diagram, illustrating the construction of a floating-gate memory cell in the integrated circuit of FIG. 1.

DETAILED DESCRIPTION OF THE INVENTION

The present invention will be described in connection with its preferred embodiment, namely as implemented into an integrated circuit that includes embedded non-volatile memory. It is contemplated, however, that this invention will provide important advantages when implemented in a wide range of applications, including stand-alone memory integrated circuits, including those of the "UV-erasable" EPROM, "flash" EEPROM, and one-time-programmable types of non-volatile memory, among other memory, logic, and analog integrated circuits. Accordingly, it is to be understood that the following description is provided by way of example only, and is not intended to limit the true scope of this invention as claimed.

Figure 1:
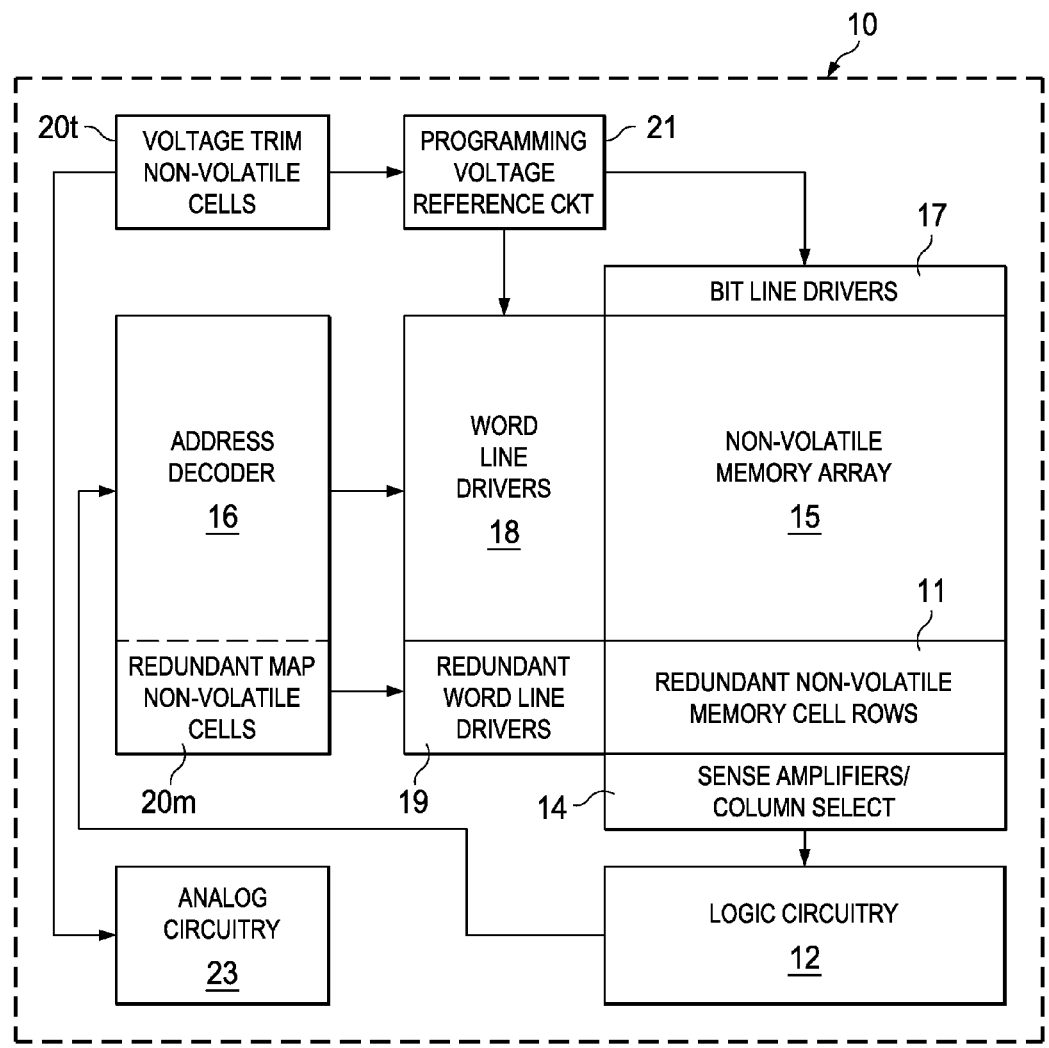
FIG. 1 is a plan view, in block form, of an integrated circuit including non-volatile memory elements constructed according to embodiments of this invention.

FIG. 1 illustrates, in block diagram form, a generic layout of integrated circuit 10, constructed according to embodiments of this invention. Integrated circuit 10, in this example, is a large scale logic circuit, such as a microprocessor or microcomputer, including programmable or hard-wired logic circuitry 12 for carrying out the logic functionality of integrated circuit 10. For example, if logic circuitry 12 is of the programmable type, it will execute program instructions retrieved from program memory; in this regard, non-volatile memory array 15 is included within integrated circuit 10, as "embedded" memory, for example serving as program memory for logic circuitry 12. Of course, other arrangements and uses of memory array 15 and logic circuitry 12 may alternatively be implemented.

In this example, non-volatile memory array 15 consists of a number of electrically programmable read-only memory (EPROM) memory cells, each including a floating-gate transistor. These memory cells are arranged in rows and columns within memory array 15, as conventional in the art. In this embedded arrangement, logic circuitry 12 accesses memory array 15 by applying address signals to address decoder 16, which decodes a portion of the address to select one or more word line drivers 18. Word line drivers 18 are each associated with a row of memory cells in memory array 15, and drive an active level on a word line selected based on the received address. The activated word line in turn connects the selected row of memory cells in memory array 15 to bit lines associated with columns of memory array 15. Sense amplifiers/column select 14 detect the data state presented at the bit lines of the selected row, and forward the sensed state of one or more of the memory cells to logic circuitry 12, also according to the address value.

According to this example, one or more rows 11 of redundant non-volatile memory cells are provided. Each of these redundant rows 11 may replace a row of memory cells within array 15, in the event that defective cells are present in that replaced row. Redundant rows 11 have their own word lines, driven by redundant word line drivers 19 in this example. In this example, a group of redundant map non-volatile memory cells 20m are provided within address decoder 16, and can be programmed to map the address of a defective row in array 15 instead to one of the redundant rows 11. After programming redundant map cells 20m with the desired mapping, address decoder 16 will select one of redundant word line drivers 19 upon receipt of the address value for the defective row in array 15. The selected word line driver 19 will in turn select the corresponding one of redundant rows 11 for communication with sense amplifiers/column select 14. This mapping operation is essentially transparent to logic circuitry 12.

As known in the art, redundant columns of memory cells may also be implemented, either in substitution for or in combination with redundant rows 11. Similar mapping is provided by way of programmable memory cells, to map one or more column address values to the redundant columns in replacement of one or more columns of memory array 15.

For programming purposes, bit line drivers 17 are provided for memory array 15. Bit line drivers 19 drive the bit lines in memory array 15 to the desired voltage for programming operations, as well as for precharge prior to a conventional read cycle. In this example, the programming voltage applied by bit line drivers 17 is higher than a typical voltage during operation. This higher programming voltage is generated by programming voltage reference circuit 21, which may be a charge pump or other voltage reference circuit. In this example, voltage trim non-volatile memory cells 20t are provided to allow the user to programmably adjust (i.e., "trim") the programming voltage as generated by reference circuit 21. In addition, in this example, integrated circuit 10 includes analog circuitry 23, which provides analog functionality such as analog input/output, signal conversion, and the like as desired for integrated circuit 10. Voltage trim on-volatile memory cells 20t also can be used to programmably trim reference voltages generated by or applied to analog circuitry 23.

Of course, integrated circuit 10 can be constructed according to countless variations of the architecture shown in FIG. 1, including more or fewer circuit blocks and elements, and different circuit blocks and elements, from those shown. In addition, the arrangement of FIG. 1 is presented according to an example of the physical placement of the various functions; specifically, the arrangement of FIG. 1 is intended to convey that non-volatile memory cells 20m, 20t other than those provided within memory array 15 may be realized within integrated circuit 10, at locations apart from the physical region of memory array 15. Generally, the number of non-volatile memory cells 20m, 20t will be much smaller than the number of memory cells in memory array 15, and as such the placements of non-volatile memory cells 20m, 20t occupy a smaller area than memory array 15. Those skilled in the art having reference to this specification will readily recognize that the arrangement of FIG. 1 is provided by way of example only, simply for purposes of this description of embodiments of this invention, and that the layout of similar functions in an integrated circuit can also vary widely from that of FIG. 1.

In this example, each of the non-volatile memory cells 20t, 20m are constructed similarly as the non-volatile memory cells in memory array 15. FIG. 2a shows an electrical schematic of such memory cells, to illustrate an example of its interconnection into memory array 15. As shown in FIG. 2a, floating-gate transistor 2 is a metal-oxide-semiconductor (MOS) transistor, with its source connected directly or indirectly (e.g., via an enable transistor) to ground. The drain of floating-gate transistor 2 is connected to bit line BL in memory array 15, while the control gate of floating-gate transistor 2 is connected to word line WL. In the context of redundant non-volatile memory cells 20m and trim non-volatile memory cells 20t, in which transistors 2 are not necessarily arranged in rows and columns, bit line BL and word line WL may correspond to control lines driven by logic and driver circuitry to similar voltages at analogous times, as in memory array 15. As suggested by the schematic diagram of FIG. 2, transistor 2 includes a floating gate element, which is electrically isolated from the source, drain, and control gate of the device.

FIG. 2b illustrates, in cross-section, the physical construction of an example of floating-gate transistor 2. Many variations to the structure of floating gate transistors are known in the art; embodiments of this invention are applicable to all such variations in structure. As such, the simplified structure of FIG. 2b is provided by way of example only.

In this example, transistor 2 is formed at a surface of silicon substrate 24, which is relatively lightly-doped p-type in this example of n-channel transistor 2. Substrate 24 may consist of a single-crystal silicon substrate, or alternatively may be formed in an epitaxial layer or in a single-crystal layer according to a Silicon-On-Insulator ("SOI") technology. Isolation oxide 25 defines active regions of the surface of substrate 24. In this example, isolation oxide 25 is formed as shallow trench isolation (STI), in which silicon dioxide is deposited into previously etched trenches formed into the surface. Alternatively, isolation oxide 25 may be formed by way of conventional local oxidation of silicon (LOCOS) techniques. Floating gate element 30 overlies a portion of the active region between isolation oxide 25 structures, and is typically constructed of polycrystalline silicon (polysilicon), patterned and etched to remain at the desired locations. Gate dielectric layer 29 is disposed between floating gate element 30 and the surface of substrate 24, and may be formed of thermal or deposited silicon oxide, silicon nitride, or another conventional gate dielectric material. Control gate element 32 is another polysilicon conductor, which in this case is disposed to overlie floating gate element 30, separated therefrom by a dielectric layer. Source/drain regions 26 are heavily doped n-type diffused regions formed into the surface of substrate 24, in a self-aligned fashion relative to either or both of floating gate element 30 and control gate element 32. Metal conductors are connected, via conventional contact openings (not shown) to connect to source/drain regions 26 and control gate 32, as shown. Floating gate element 30 remains electrically isolated from source/drain regions 26 and control gate 32.

In operation, charge carriers (typically electrons) may be trapped onto floating gate element 30 in a programming operation. In this regard, gate dielectric layer 29 will be relatively thin, on the order of 10 nm, to allow electrons to tunnel from source/drain regions 26 in substrate 24 onto floating gate element 30. Programming occurs by way of such tunneling, under bias conditions in which ground or a low voltage is applied to the drain (one of source/drain regions 26) and a high positive voltage is applied to control gate element 32 of transistor 2, such that free electrons driven from the transistor drain may gain sufficient energy to tunnel to and become trapped on floating gate element 30, attracted by the positive voltage at control gate 32, to the extent it couples to floating gate element 30. Conversely, light energy at ultraviolet wavelengths can couple to these trapped electrons, energizing these carriers to the extent that they are ejected from floating gate element 30 into surrounding regions such as p-type substrate 24 or control gate 32. In some cases, an erase bias condition is applied (high voltages at the source and drain, and ground or a low voltage at control gate element 32), to drive the trapped carriers from floating gate element 30 in an erase operation.

Referring back to FIG. 1, because the functionality of redundant map non-volatile memory cells 20m and trim non-volatile cells 20t, these cells 20m, 20t are programmed at most once, during device manufacture only. In this case, continued proper functionality of integrated circuit 10 depends on these non-volatile cells 20t, 20m retaining their programmed state. For example, as described above, redundant map cells 20m may be programmed during manufacturing testing, upon detecting one or more defective memory cells in rows in memory array 15. In this case, redundant map cells 20m are programmed as necessary to map the row address of the defective row to one of redundant rows 11. Similarly, trim non-volatile memory cells 20t may be programmed to adjust an analog level according to results of manufacturing tests. In each case, the programmed states of non-volatile cells 20t, 20m are intended to remain, and not be erased, throughout the system life of integrated circuit 10. On the other hand, non-volatile memory cells within memory array 15 may be user-programmed, and perhaps erased by the user and re-programmed, during the useful life of integrated circuit 10. As such, exposure of integrated circuit 10 to ultraviolet light that causes erasure of non-volatile cells 20t, 20m, once programmed, could prove fatal to the proper functionality of integrated circuit 10.

According to embodiments of this invention, shielding structures are physically constructed to protect non-volatile cells 20t, 20m from ultraviolet light. A generalized example of such an ultraviolet shield, according to embodiments of this invention is illustrated in FIG. 3 by way of the example of shielding structure 30.

Shielding structure 30 overlies a region (not shown) containing the non-volatile memory cells that are to be protected from unintended erasure due to exposure to ultraviolet light. In this example, as shown in FIG. 3, shielding structure 30 includes roof structure 32, which in this example is a rectangular element formed in one of the metal layers of integrated circuit 10. Given its metal composition (e.g., aluminum, copper, or other metal material used in the fabrication of integrated circuit 10), roof structure 32 is opaque to ultraviolet light.

Roof structure 32 is supported by a number of contact posts 35 that are disposed around the perimeter of roof structure 32. In this simplified example, contact posts 35 extend upward from diffused region 34 at the surface of substrate 24. Contact posts 34 are formed of tungsten, polysilicon, aluminum, copper or other conductive material, and as such are opaque and preferably reflective to ultraviolet light. As evident from FIG. 3, and as will be described in further detail below, contact posts 35 may be arranged in multiple rows, with one or more additional rows placed inside of the outermost row of contact posts 35. Electrical connection to memory cells in the protected region is made, in this example, by conductors 36a, 36b that are formed in an intermediate conductor metal or polysilicon layer. This intermediate conductor layer in which conductors 36a, 36b are formed is, in this example, above diffusion region 34 but below the metal layer of roof structure 32. Each of conductors 36a, 36b is placed within a gap in the rows of contact posts along sides of roof structure 32 and diffused region 34. As will be described in further detail below, light barriers are present along conductors 36a, 36b to reflect stray light entering through the gaps from reaching the underlying memory cells; those barriers are not visible in the perspective view of FIG. 3.

Figure 3:
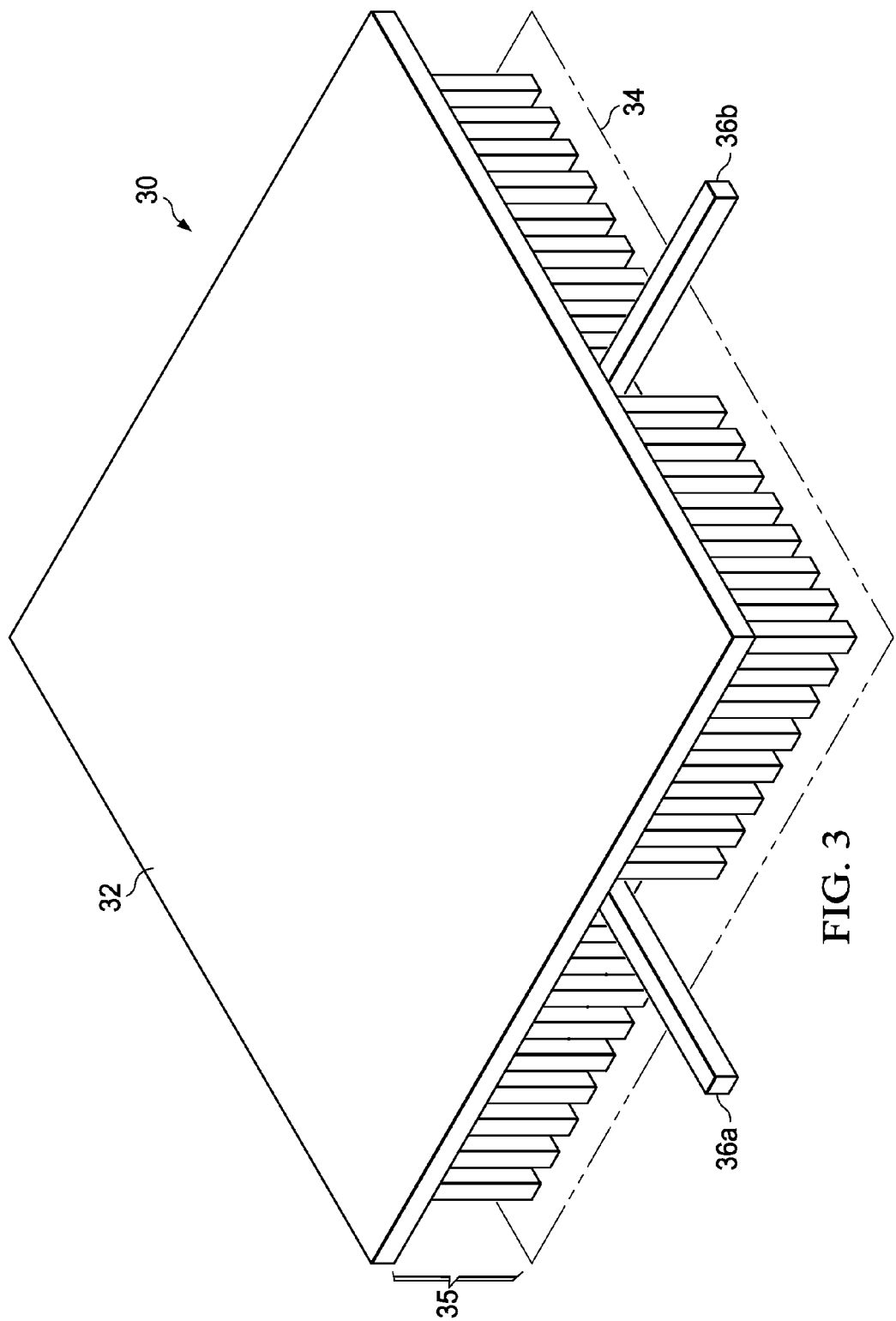
FIG. 3 is a perspective view of a shielding structure according to embodiments of the invention.

As evident from FIG. 3, roof structure 32 protects its underlying memory cells from incident ultraviolet light in a direction normal to the surface of substrate 24. As will be described in detail below, contact posts 35 reflect incident ultraviolet light in a direction that is substantially parallel to the surface of substrate 24. In addition, the width of contact posts 35 and their spacing relative to one another causes interference in the incident light passing through the spaces between adjacent contact posts 35, similar to a diffraction grating. Because of these dimensions, incident light parallel to the surface of substrate 24 is either reflected or attenuated by destructive interference.

Figure 4A:
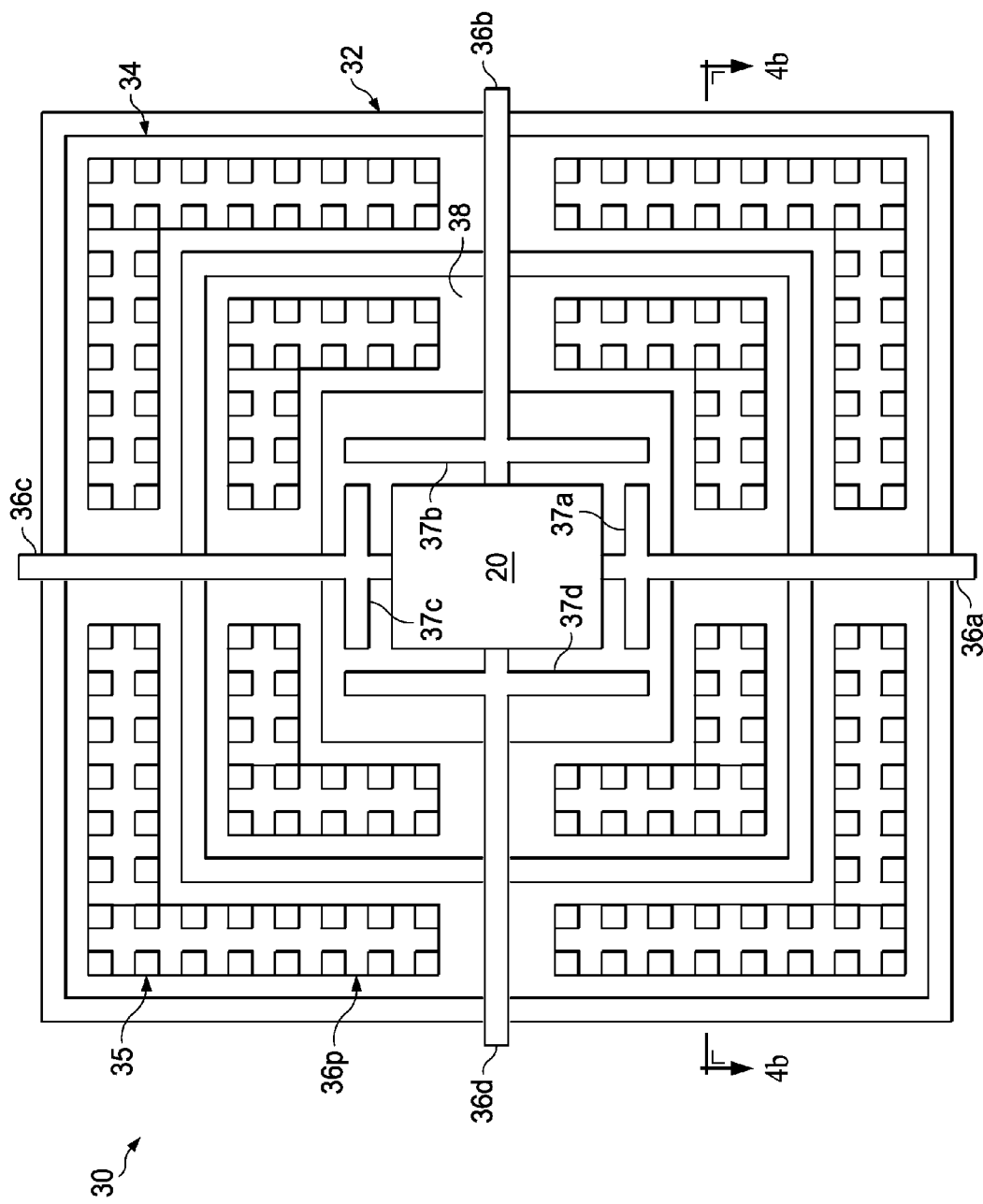
FIGS. 4a and 4b are a plan view and a cross-sectional view, respectively, of a shielding structure according to an embodiment of the invention.
Figure 4B:
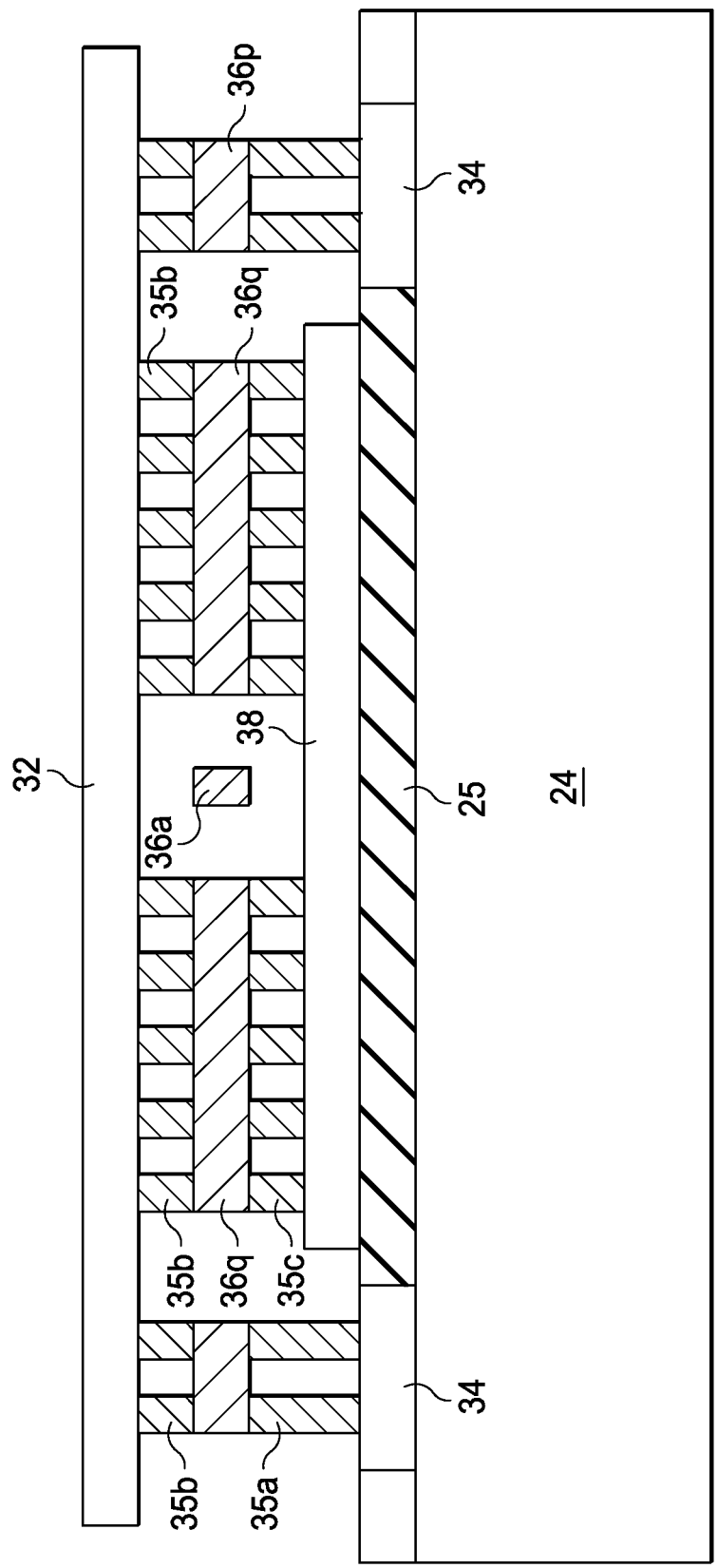

FIG. 4a illustrates an example of shielding structure 30 according to an embodiment of the invention, in plan view with some underlying layers visible below overlying roof structure 32 for the sake of this description. FIG. 4b is a corresponding cross-sectional view of the structure of FIG. 4a, as taken through some contact posts 35.

Referring to FIG. 4a, memory cell region 20 underlies a central portion of shielding structure 30, in this case at a central portion underlying roof structure 32. Memory cell region 20 includes one or more non-volatile memory cells (not shown), which are to be shielded from incident ultraviolet light by shielding structure 30. The appropriate and necessary structural elements of non-volatile memory cells, including diffused regions, polysilicon and metal electrodes serving as gate and interconnect elements, isolation structures, and the like, are provided within memory cell region 20. In this example, metal conductors 36a, 36b, 36c, 36d provide connection between memory cells within region 20 and circuitry in integrated circuit 10 external to shielding structure 30. Roof structure 32 is formed in a second metal level, above the metal level in which metal conductors 36a through 36d are formed. Metal conductors 36a through 36d, and also roof structure 32, may be formed of any conventional metal according to embodiments of this invention, including aluminum, copper, tungsten, alloys, and the like, and as typical for metals, will be opaque to light including ultraviolet light.

Diffused region 34 surrounds memory cell region 20, and underlies roof structure 32 near its edges. As evident from the simplified cross-section of FIG. 4b, the location of diffused region 34 within the surface of substrate 24 is defined by isolation oxide structures 25. Isolation oxide structures 25 may be shallow trench isolation structures, LOCOS oxide, or some other isolation dielectric, as described above relative to FIG. 2b. Diffused region 34 may either be n-type or p-type, depending on the conductivity type of the underlying portion of substrate 24 into which it is formed (e.g., whether formed into an n-type or p-type well, in CMOS technology, etc.). Because metal contact posts 35 are in contact with diffused region 34, diffused region 34 will typically be relatively highly-doped, to ensure good ohmic contact.

Polysilicon ring 38 is disposed under roof structure 32 in this embodiment of the invention, placed inside of diffused region 34. Polysilicon ring 38 may be formed in the same polysilicon level as one of the gate electrodes of memory cells in region 20 (e.g., in the same level and to the same thickness as either of floating gate 30 or control gate 32 in FIG. 2b), to facilitate manufacture. As shown in FIG. 4b, polysilicon ring 38 overlies isolation oxide structure 25.

As shown in the plan view of FIG. 4a for this embodiment of the invention, multiple contact posts 35 are disposed over and in contact with diffused region 34 and polysilicon ring 38. In this example, two rows of stacked contact posts 35 (including both contact and via posts, as will be described in further detail below) are in contact with diffused region 34, and two rows of stacked contact posts 35 are in contact with polysilicon ring 38. The spacing between adjacent contact posts 35, both in the same row, between the adjacent rows at diffusion region 34, and between the adjacent rows at polysilicon ring 38, is sufficiently close to cause interference in incident ultraviolet light, specifically light that is at wavelengths that cause erasure of memory cells in memory region 20. Particulars in the width and spacing of contact posts 35 according to embodiments of this invention will be described in further detail later in this specification.

As shown in FIG. 4b, according to this embodiment of the invention, each contact post 35 makes contact with a corresponding metal element in the same metal layer (e.g., first metal level) as conductors 36a through 37d. In this embodiment of the invention, those contact posts 35 overlying diffused region 34 are constructed as "stacked" contacts, in that each of these stacked contacts consists of lower contact plug 35a extending between diffused region 34 and metal element 36p, and upper contact (i.e., via) plug 35b extending between metal element 36p and overlying roof structure 32. Similarly, stacked contact posts 35 are also disposed over polysilicon ring 38, each including lower contact plug 35c extending between polysilicon ring 38 and metal element 36q, and upper contact (i.e., via) plug 35b extending between metal element 36q and roof structure 32. For purposes of this description, contact posts 35 will refer to contact structures, whether formed as contact posts, via posts, or stacked contacts including both a contact post and a via post as shown in FIG. 4b. This formation of contact posts 35 as stacked contacts facilitates their fabrication, by minimizing the depth to which contact openings need be etched. In this manner, lower contact plugs 35a and contact plugs 35c can be formed in the same process even though extending to different depths, facilitating manufacture. Upper contact plugs 35c can, of course, be formed in the same process regardless of whether formed over diffused region 34 or polysilicon ring 38.

Alternatively, contact posts 35 may be formed as conventional single contact elements (i.e., not as "stacked" contacts), which extend from diffused region 34 or polysilicon ring 38 to overlying roof structure 32. In this case, of course, no intervening metal element 36p, 36q will be present within those non-stacked contact posts 35.

As mentioned above, conductors 36a through 36d run from external to shielding structure 30 through openings in the rows of contact posts 35, to connect with elements of memory cells in memory cell region 20. Of course, light can readily travel through these openings along the sides of shielding structure 30, because contact posts 35 are not present in those openings. According to this embodiment of the invention, each conductor 36a through 36d is constructed to also have a cross-member 37a through 37d, respectively. Each cross-member 37a through 37d is of the same metal composition and in the same metal level as its corresponding conductor 36a through 36d, and in this embodiment of the invention is disposed perpendicularly to the major axis of its corresponding conductor 36a through 36d. Cross-members 37a through 37d are disposed nearer to memory cell region 20 than contact posts 35, in this embodiment of the invention. The lengths of cross-members 37a through 37d can be selected to correspond to the size of the openings through contact posts 35. As a result of this construction, cross-members 37a through 37d serve to reflect light entering shielding structure 30 at the openings in contact posts 35 at which conductors 36a through 36d pass, thus protecting memory cells in memory cell region 20 from unintended erasure.

Figure 5A:
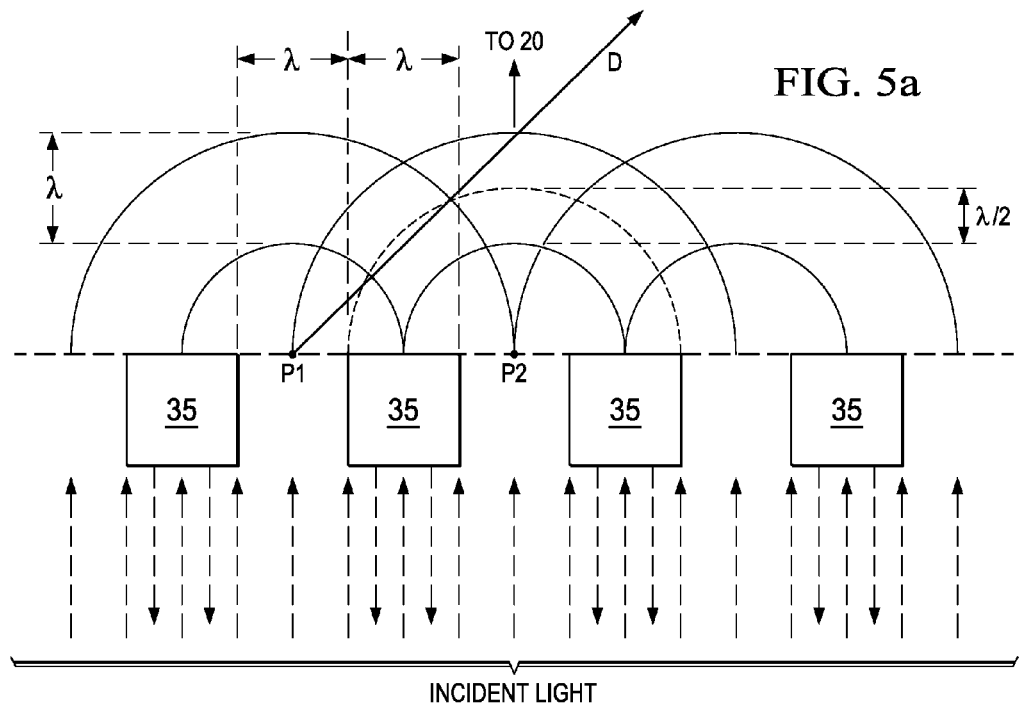
FIGS. 5a through 5c are plan views of one or more rows of contact posts in the shielding structure according to embodiments of the invention.

The operation of spaced-apart contact posts 35 in blocking ultraviolet light from reaching memory cell region 20 according to embodiments of this invention will now be described in connection with FIGS. 5a through 5c. FIG. 5a illustrates a portion of a row of contact posts 35. For this description, this row of contact posts 35 will be considered as the outermost row at diffused region 34. According to this embodiment of the invention, contact posts 35 are each constructed of a metal, such as tungsten, copper, or aluminum (or combinations thereof), that is opaque to ultraviolet light. According to this embodiment of the invention, the width of each contact post 35, as well as the spacing between adjacent contact posts 35, are each on the order of magnitude of the wavelength $\lambda$ of light that erases memory cells (i.e., that dislodges trapped carriers from floating gate elements). For example, a typical wavelength of light that causes substantial erasure in modern EPROM memory cells is the 253.7 nm UVC (shortwave UV) mercury line, produced by a deep-blue-violet quartz lamp with no phosphor. As such, the width and spacing of contact posts 35 in the portion of the row shown in FIG. 5a are at a dimension on the order of 253.7 nm.

The particular width and spacing of contact posts 35, relative to the wavelength $\lambda$, need not be exact, according to embodiments of this invention. These dimensions of contact width and spacing for contact posts 35 are selected, however, to result in significant destructive interference in incident light as it passes between contact posts 35. As such, it is contemplated that contact post 35 width and spacing should have some relationship to the wavelength $\lambda$, for example ranging from about one-half the wavelength $\lambda$ to about two times the wavelength $\lambda$. It is believed that contact posts 35 having a width and spacing at about one-half the wavelength $\lambda$ or less will have about the same effectiveness as a solid wall structure. The width and spacing dimensions of contact posts 35 need not equal one another. However, the design rules for modern integrated circuits generally set these dimensions close to one another, if not exactly equal, especially at submicron feature sizes. For example, under one set of current design rules, the minimum contact width dimension is 270 nm, and the minimum contact spacing is 270 nm, both as patterned. As known in the art, the actual physical dimensions of contact posts 35 (or, more accurately, of contact openings through an insulator layer into which contact posts 35 are deposited) may vary from the dimensions as patterned, because of the characteristics of the contact etch being used. In addition, actual physical contact openings, and thus contact posts 35, may have circular cross-sections, rather than the square or rectangular cross-sections as shown in FIG. 5a, especially at these submicron feature sizes. For purposes of this description, however, the patterned square cross-sections for contact posts 35 will be used.

Referring back to FIG. 5a, light that is incident upon contact posts 35 will reflect back toward the source, and thus away from memory cell region 20. Of course, light that passes through the spaces between contact posts 35 will not be reflected, and will continue toward memory cell region 20. However, according to this embodiment of the invention, the close spacing of contact posts 35 relative to one another, and the relationship of this spacing to the wavelength of the light of concern, causes destructive interference in the light passing through these spaces. This destructive interference appears at points at which the path length between a wavefront passing through one opening is one-half wavelength longer than a wavefront passing through another (e.g., adjacent) opening. For example, FIG. 5a illustrates dark line D, which indicates the locus of points that are one-half length different in distance from points P1 and P2 at openings between contact posts 35. Accordingly, the close spacing of contact posts 35 not only reduce the light incident on memory cell region 20 by way of reflection from contact posts 35 themselves, but also causes destructive interference that further reduces the transmitted light.

As discussed above, FIGS. 4a and 4b show the placement of multiple rows of contact posts 35. These multiple rows further reduce the light that reaches memory cell region 20 in this embodiment of the invention, as will now be described relative to FIG. 5b. In this example, contact posts 35 are constructed at similar spacing and widths as described above relative to FIG. 5a. Row "1" of contact posts 35 shown in FIG. 5b correspond to those shown in FIG. 5a. In this embodiment of the invention, however, a second row (row "2") of contact posts 35 are placed near row "1" of contact posts 35, specifically at a spacing between rows "1" and "2" of on the order of the wavelength $\lambda$ of the light of concern. For example, for contact posts 35 formed at the minimum design rules for contact opening width and spacing, as described above, the inter-row spacing between adjacent contact posts 35 in adjacent rows will be the same as the intra-row spacing between adjacent contact posts 35 in the same row.

Figure 5B:
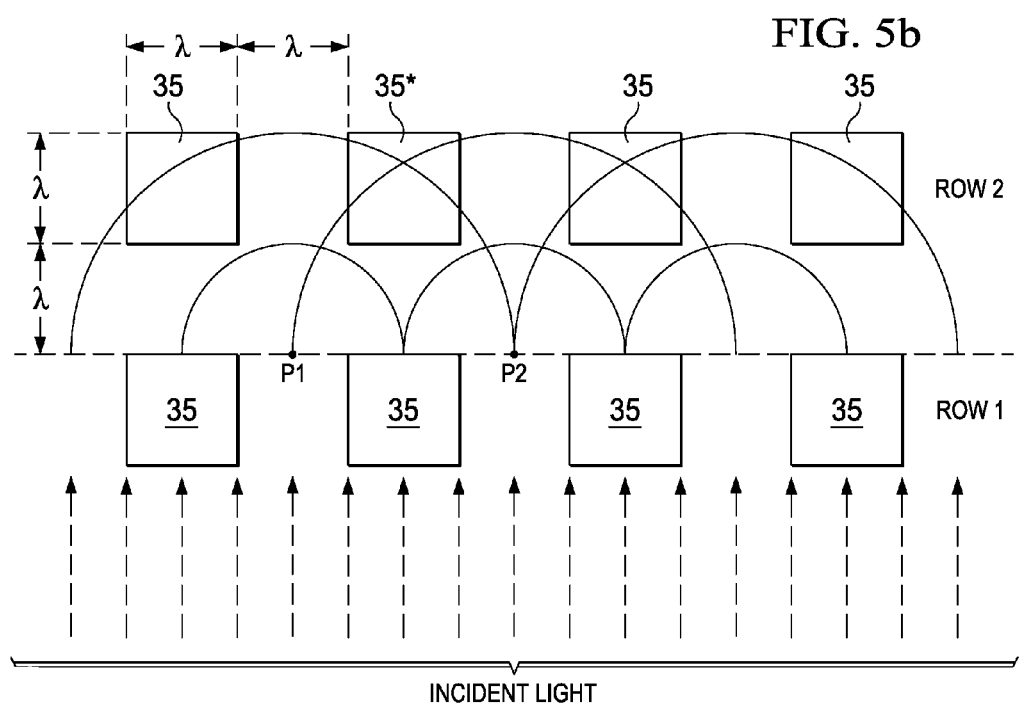

In this embodiment of the invention as shown in FIG. 4a and also in FIG. 5b, adjacent contact posts 35 in adjacent rows are aligned with one another, in the sense that contact posts 35 in different rows are essentially collinear with one another (center to center) along lines perpendicular to the sides of shielding structure 30. In other words, adjacent contact posts 35 in adjacent rows will appear one behind the other to incident light traveling in a direction perpendicular to the sides of shielding structure 30. As known in the art, diffraction gratings not only cause destructive interference, but also cause constructive interference of light at those points at which the light passing through the various openings align in phase. However, multiple rows of contact posts 35 according to this embodiment of the invention serve to block this transmitted constructively interfering light also. For example, in the arrangement of FIG. 5b, the aligned contact posts 35 in multiple rows serve to block the n=0 interference mode, which corresponds to light at points that are the same distance from openings in the grating. For example, contact post 35* in row "2" will reflect light of the n=0 constructive interference mode, as its location is equidistant from points P1 and P2 at adjacent openings in row "1".

Figure 5C:
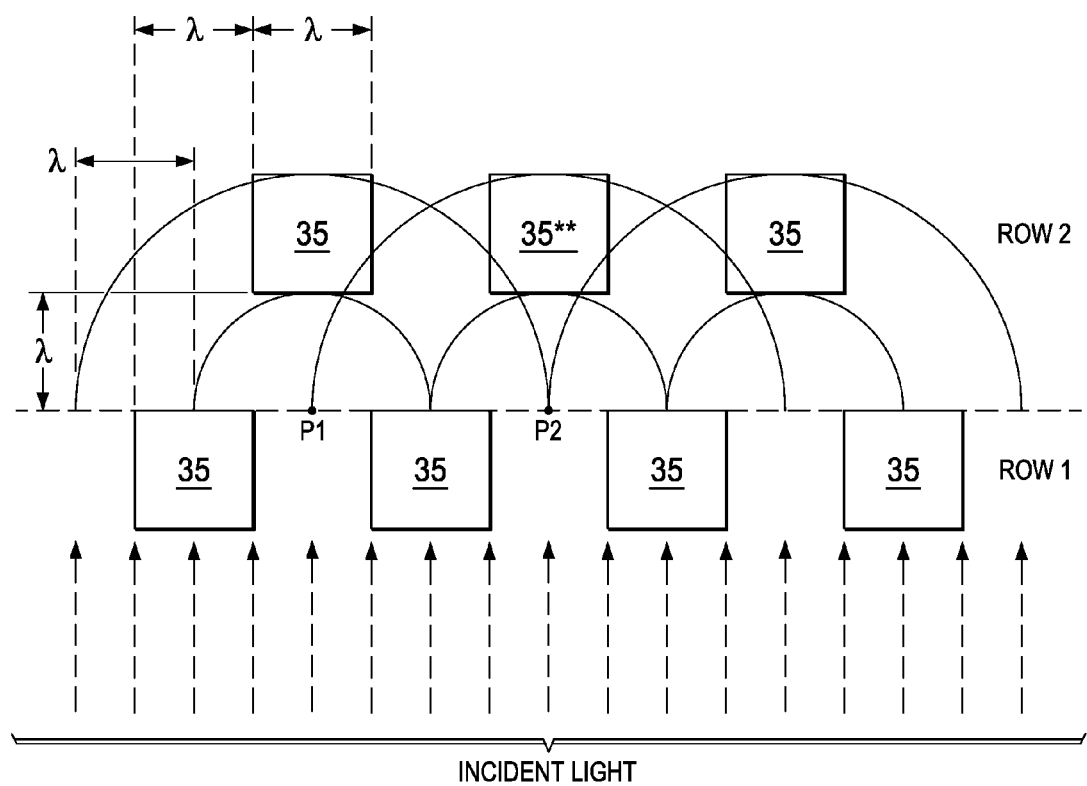

FIG. 5c illustrates another arrangement of contact posts 35 in adjacent rows. In this example, contact posts 35 in row "2" are staggered relative to contact posts 35 in row "1", essentially filling the openings between contact posts 35 in row "1" (as viewed from the sides of shielding structure 30). In this arrangement, the n=0 interference mode of incident light passing through the openings in row "1" is not blocked, but rather the n=1 interference mode is blocked by contact posts 35 in row "1". For example, contact post 35** in row "2" will reflect light of the n=1 constructive interference mode, as its location is one wavelength farther from point P1 than it is from point P2.

Many variations to the construction of shielding structure 30 described above are contemplated. It has been observed, in connection with this invention and by way of experiment, that variations in the construction of shielding structure 30 can be made in order to optimize the tradeoff between chip area and shielding. More specifically, it has been found that even a single row of contact posts 35 extending from roof structure 32 to diffused region 34 can provide significant UV shielding, even in the absence of polysilicon ring 38 and its corresponding contact posts 35; similarly, a single row of contact posts 35 extending to polysilicon ring 38 in the manner illustrated in FIGS. 4a and 4b also provides significant UV shielding, even in the absence of contact posts 35 to diffused region 34. Multiple rows of contact posts 35 to either diffused region 34 or polysilicon ring 38 increase the UV shielding, due to the mechanism described above in connection with FIGS. 5b and 5c. Experiment has shown that the staggered arrangement of FIG. 5c provides improved shielding relative to the aligned arrangement in FIG. 5b; in some cases, the staggered alignment provided better shielding than an additional row of aligned contact posts 35. And, of course, the provision of cross-members 37 along each conductor 36 prevents entry of stray ultraviolet energy through the necessary openings for conductors to the interior memory cell region 20.

The combination of one or more rows of contact posts 35 extending from roof structure 32 to diffused region 34 with one or more rows of contact posts 35 extending to polysilicon ring 38 disposed in the interior of the area defined by diffused region 34, for example as shown in connection with FIGS. 4a and 4b, and especially in combination with cross-members 37a through 37d, has been observed to provide the optimum shielding. It is believed that the additional feature of polysilicon ring 38, disposed interior of contact posts 35 to diffused region 34, and disposed above the surface of substrate 24 and below roof structure 32, provides additional interference to and absorption of ultraviolet energy. As such, better results are obtained by construction of polysilicon ring 38 as a continuous ring around memory cell region 20. Experiment has shown that even a single row of contact posts 35 to diffused region 34, in combination with a single row of contact posts to polysilicon ring 38 interior to diffused region 34, as shown in FIG. 4a, provides better ultraviolet shielding than does a structure with two rows of contact posts 35 to either of diffused region 34 or polysilicon ring 38, individually. Alternatively, an interior feature disposed between contact posts 35 to diffused region 34 and memory cell region 20, and between the surface of substrate 24 and roof structure 32, may be formed of other opaque materials, including metal.

As mentioned above, multiple rows of contact posts 35 to both diffused region 34 and to polysilicon ring 38 provides optimum ultraviolet shielding. However, this construction of course consumes additional chip area, as do cross-members 37a through 37d. It is contemplated that those skilled in the art having reference to this specification will be readily able to select the best arrangement of shielding elements for the available chip area in particular applications, without undue experimentation.

The use of spaced-apart contact posts 35 according to embodiments of this invention also enables the fabrication of integrated circuit 10 by processes including chemical-mechanical polishing (CMP). As mentioned above, conventional shielding structures that are constructed as a "box", with solid metal walls surrounding the shielded memory cells, are incompatible with CMP because such structures are prone to "dishing" and high levels of particulate contamination when planarized using CMP. FIGS. 6a through 6h illustrate a simplified process flow, including CMP processing, for the fabrication of shielding structure 30 according to an embodiment of this invention, as will now be described.

Figure 6A:
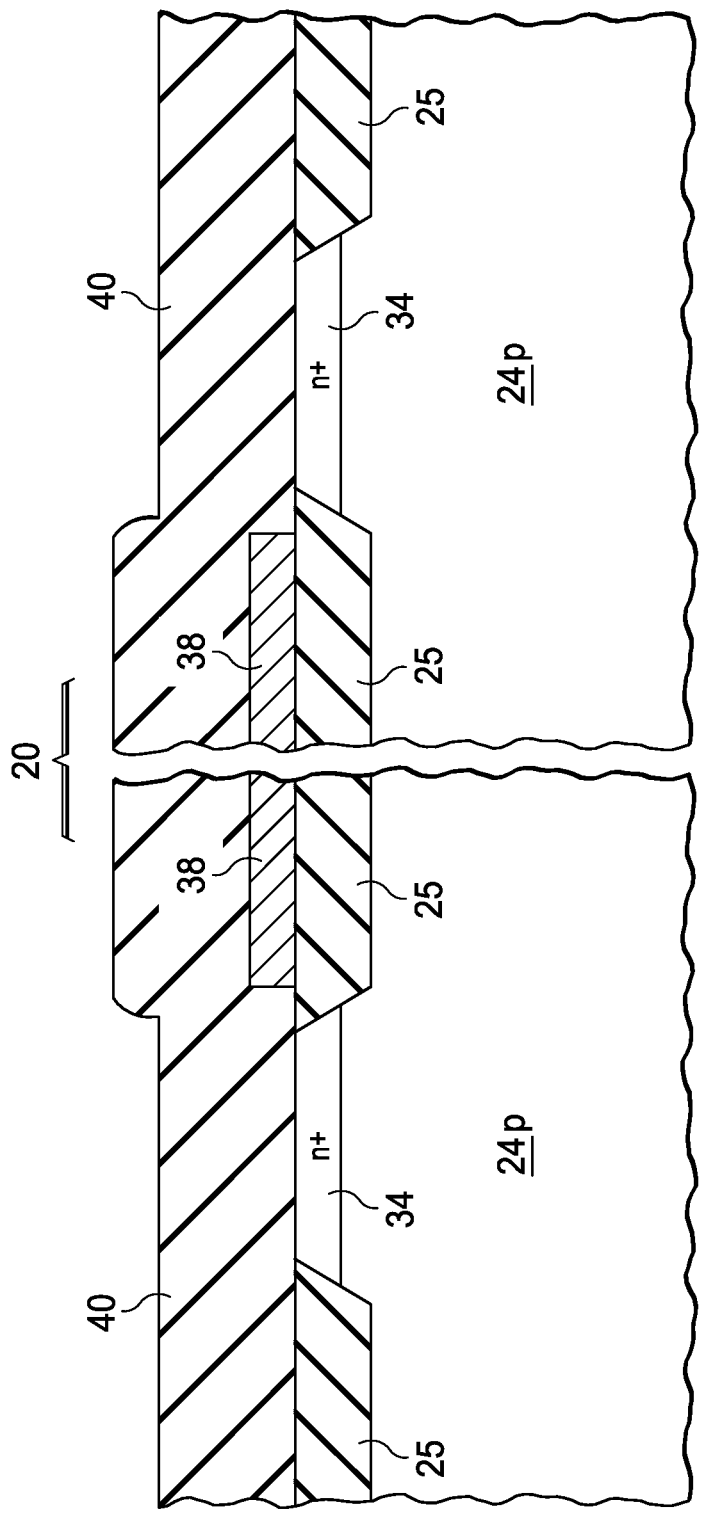
FIGS. 6a through 6h are cross-sectional views of a shielding structure according to an embodiment of the invention, at various stages of its manufacture.

FIG. 6a shows the structure of integrated circuit 10 in a cross-sectional view, essentially in a similar view as the cross-section of FIG. 4b. Memory cell region 20 is not shown in this cross-section, but will be present in the central region between the portions shown in FIG. 6a. The construction of memory cells within this memory cell region 20 will proceed in the conventional manner, as appropriate for the technology being used to fabricate those structures. The view of FIG. 6a is shown at a relatively early stage in the fabrication process. Shallow trench isolation oxide structures 25 are present at selected locations of the surface of substrate 24, and define the locations of diffused region 34. In this example, diffused regions 34 are heavily-doped n-type regions, formed by way of conventional source/drain implant after the lithographic formation of polysilicon ring 38; in transistor regions (not shown) of the structure, n+ regions such as diffused region 34 can be formed in the well-known self-aligned manner. Polysilicon ring 38 is disposed at the surface of isolation oxide structures 25, as shown in FIGS. 4b and 6a, and as such will be electrically isolated from the underlying silicon. Of course, many variations to this structure can instead be formed, including the definition and formation of p-well and n-well regions if integrated circuit 10 is fabricated according to a CMOS process. These and other variations will be familiar to those skilled in the art having reference to this specification, and can be included in the overall process flow of integrated circuit 10 in the usual manner.

Figure 6B:
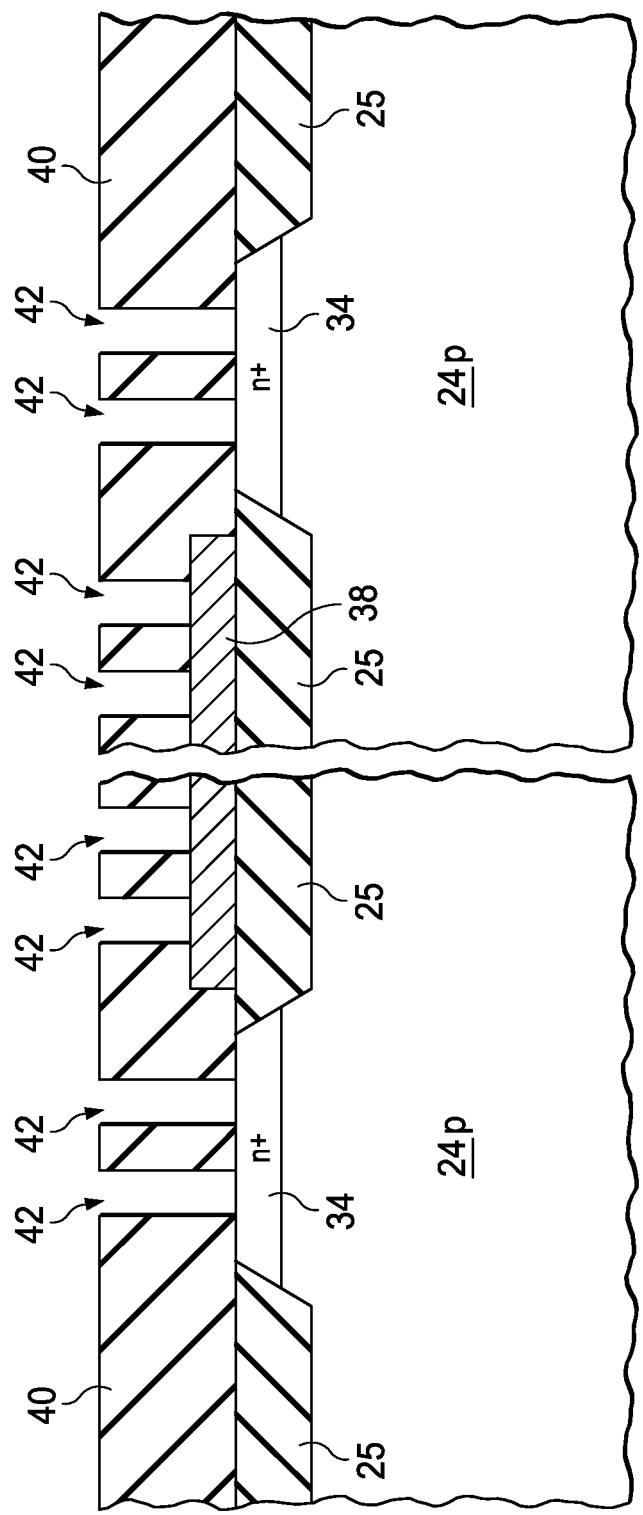

As shown in FIG. 6a, dielectric layer 40 is in place over the structure, after the formation of polysilicon ring 38 and diffused region 34. Dielectric layer 40 may be conventional silicon dioxide or other insulating material, deposited overall by way of chemical vapor deposition (CVD) or the like; following deposition of dielectric layer 40, chemical-mechanical polishing (CMP) is performed to planarize its surface. Contact openings 42 are then defined at selected locations of planarized dielectric layer 40 by conventional photolithography, and then etched in the manner (wet etch, plasma etch, or combination thereof) appropriate for the desired size of contact openings 42, and the thickness and composition of dielectric layer 40. Contact openings 42 extend through dielectric layer 40 to both diffused region 34 and also polysilicon ring 38, as shown in FIG. 6b. According to embodiments of this invention, the width and spacing of contact openings 42 are on the order of the wavelength of ultraviolet light from which memory cells in memory cell region 20 are to be shielded. This spacing refers to the spacing of adjacent contact openings 42 within the same row, and also between adjacent rows to the same underlying feature (i.e., between adjacent rows of contact openings 42 to diffused region 34, and between adjacent rows of contact openings 42 to polysilicon ring 38). For example, if ultraviolet light of a wavelength about 254 nm erases the programmed state of memory cells in region 20, the width and relative spacing of contact openings 42 will be on the order of 250 nm, for example ranging from about 125 nm or smaller (depending on the technology) to about 0.500 μm.

Figure 6C:
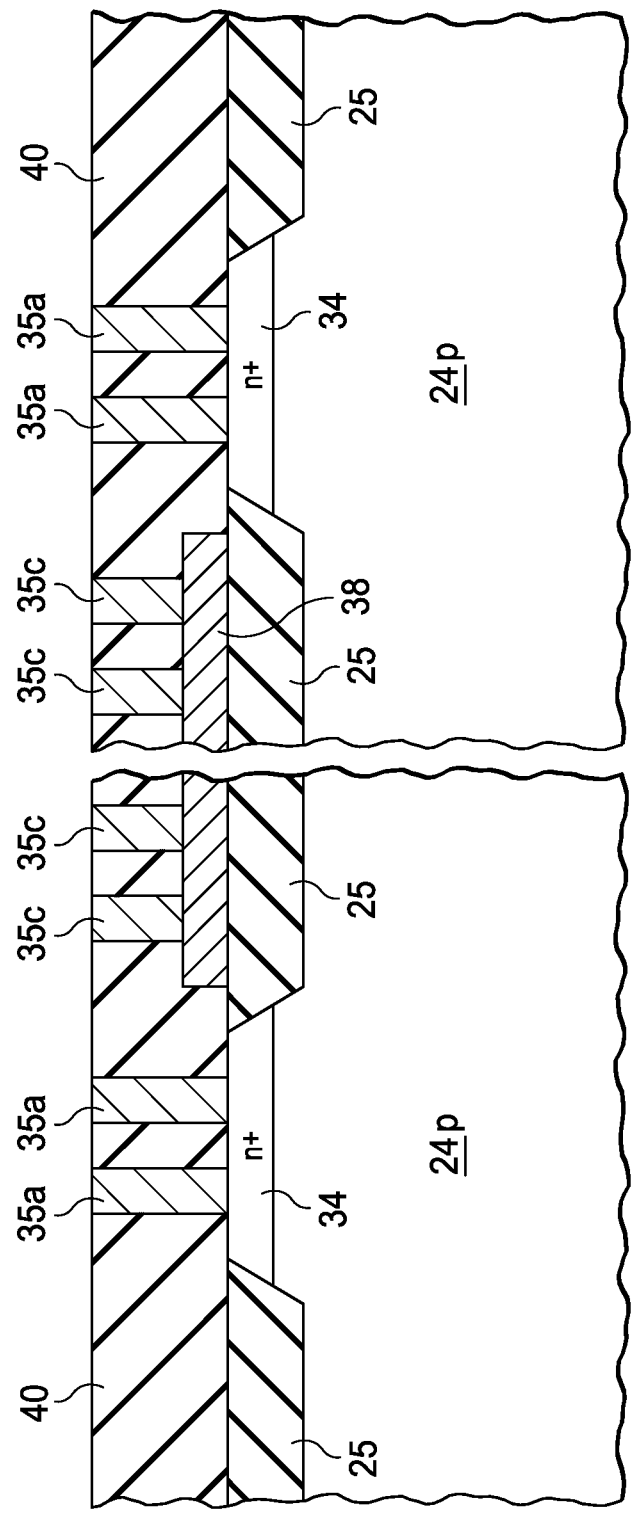

FIG. 6c shows the structure after the filling of contact openings 42 to form contact plugs 35a, 35c. As described above, contact plugs 35a, 35c are formed of a material opaque to ultraviolet light; for compatibility with the remainder of integrated circuit 10, contact plugs 35a, 35c will be formed of a conductive material, deposited in the same process as contact plugs intended to make electrical contact to underlying structures. For example, contact plugs 35a, 35c may be formed of doped polysilicon, deposited by CVD. Another conventional material useful for contact plugs 35a, 35c is tungsten, which may be deposited by selective CVD or alternatively by way of a blanket CVD tungsten deposition. Other materials, including aluminum, copper, and the like may alternatively be used to form contact plugs 35a, 35c, as known in the art. Contact plugs 35a, 35c will acquire the size and placement as defined by contact openings 42, and as such will have a width and spacing of on the order of the wavelength of ultraviolet light from which memory cells in memory cell region 20 are to be shielded. Following the deposition of the metal for contact plugs 35a, 35c, the structure may be planarized by way of CMP to remove excess tungsten, resulting in the planar surface illustrated in FIG. 6c. This planarization facilitates the formation of the first metal layer.

Figure 6D:
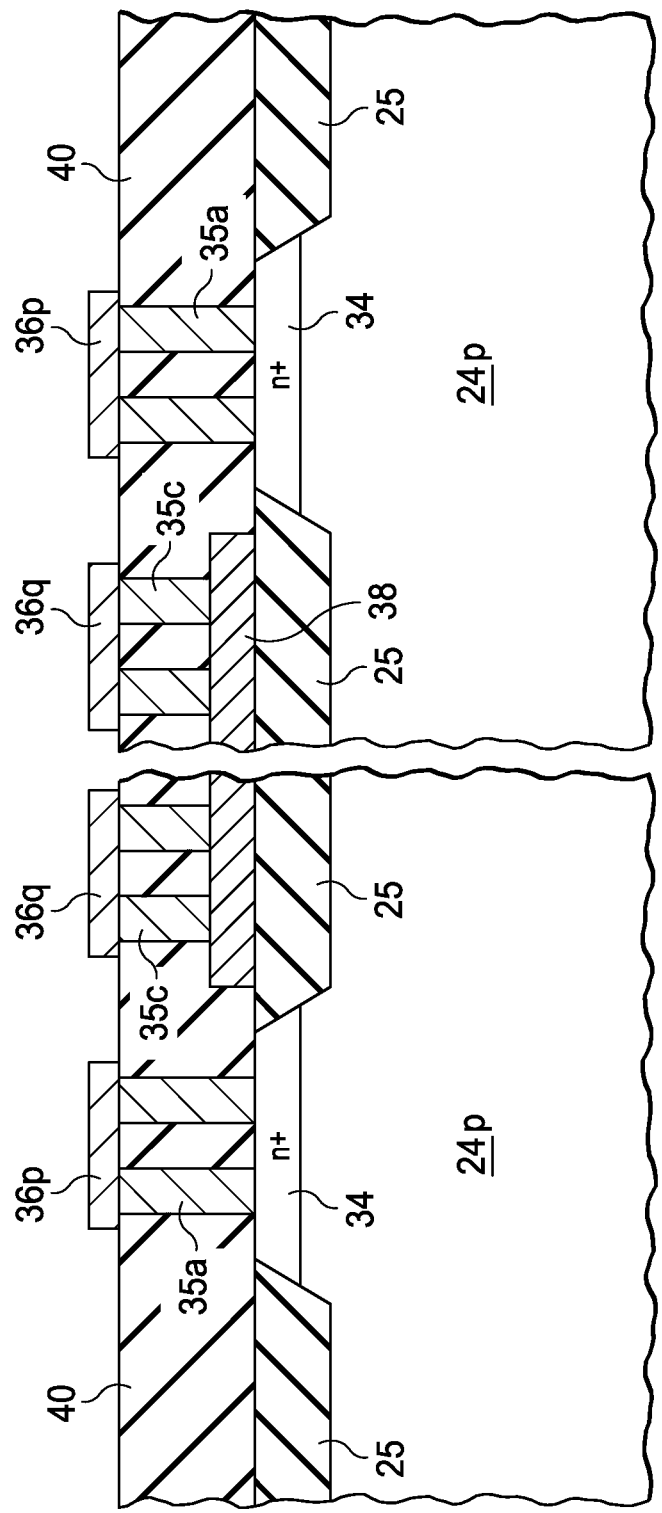

Referring now to FIG. 6d, a first metal layer is sputtered or otherwise deposited over the structure of FIG. 6c, and then patterned and etched in the conventional manner to define metal elements 36p overlying contact posts 35a extending to diffused region 34, and metal elements 36q overlying contact posts 35c extending to polysilicon ring 38. This metal layer forming metal elements 36p, 36q also forms conductors 36a through 36d and cross-members 37a through 37d, as shown in FIGS. 4a and 4b, by way of the same deposition, pattern and etch processes. As described above, metal elements 36p, 36q may be formed of aluminum, copper, or such other suitable metal as used in the fabrication of integrated circuit 10.

Figure 6E:
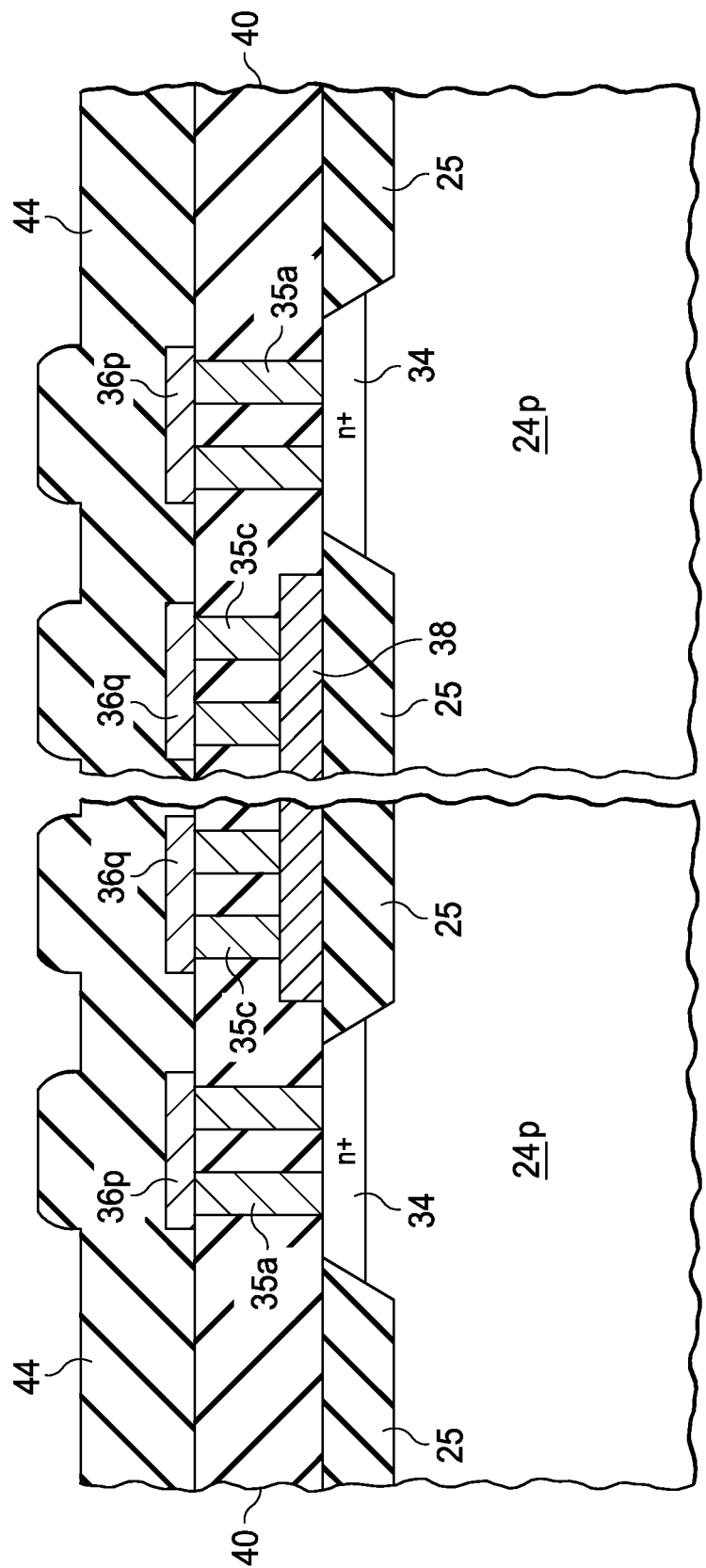
Figure 6F:
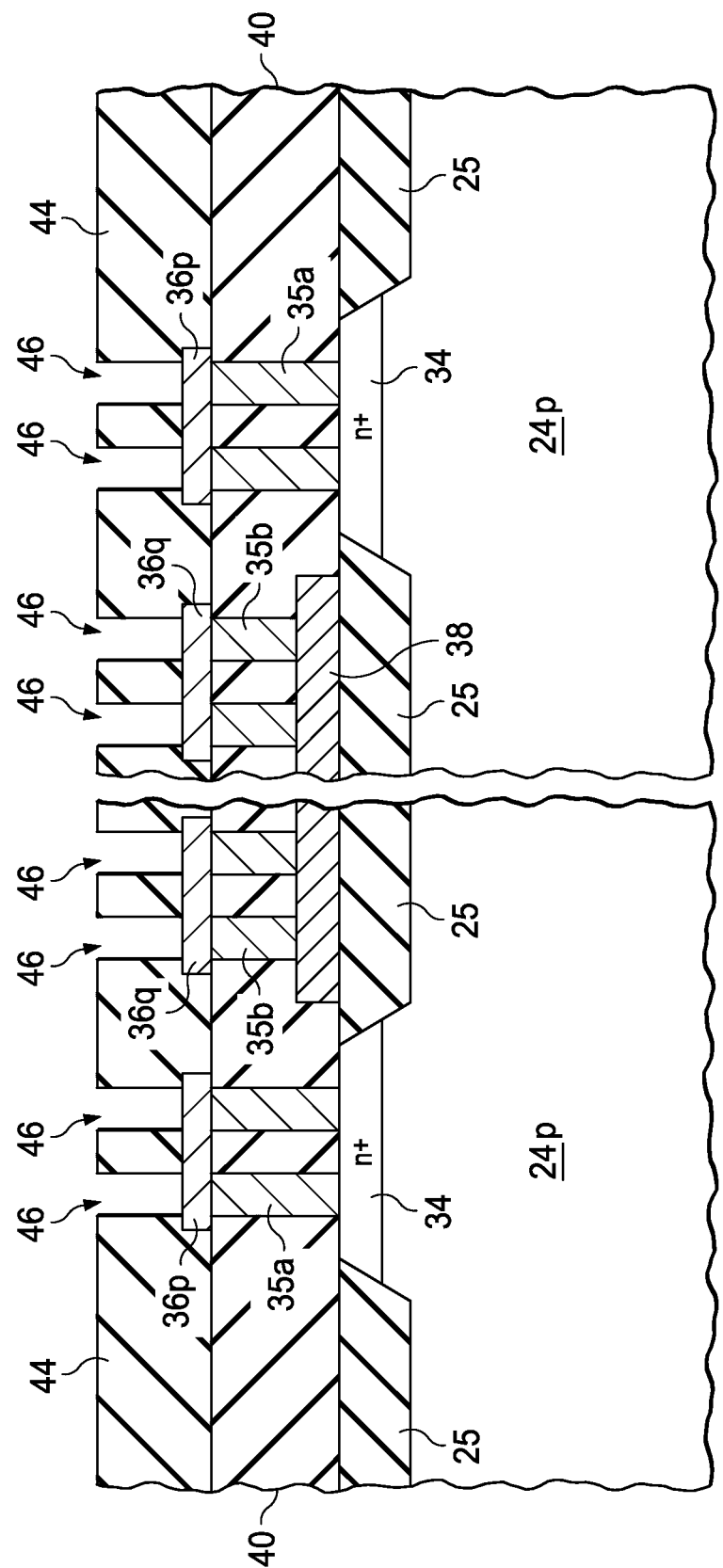

As shown in FIG. 6e, dielectric layer 44 is then deposited over the structure including metal elements 36p, 36q. Dielectric layer 44 may be silicon dioxide or another material deposited by CVD, or a spin-on organic dielectric, or such other insulating material known in the art and deposited by the appropriate method. Dielectric layer 44 is then planarized by CMP, and vias 46 are then patterned and etched at the desired locations of planarized dielectric layer 44, resulting in the structure as shown in FIG. 6f. Vias 46 define "stacked" contacts to metal elements 36p and contact plugs 35a extending to diffused region 34, and stacked contacts to metal elements 36q and polysilicon plug 38, in this example. Vias 46, in this example, will have a width and spacing about the same as underlying contact plugs 35a, 35c namely on the order of the wavelength of ultraviolet light from which memory cells in memory cell region 20 are to be shielded. In this case, contact plugs 35c are all etched to the same depth, from the planarized top surface of dielectric film 44 to first metal elements 36p, 36q.

Figure 6G:
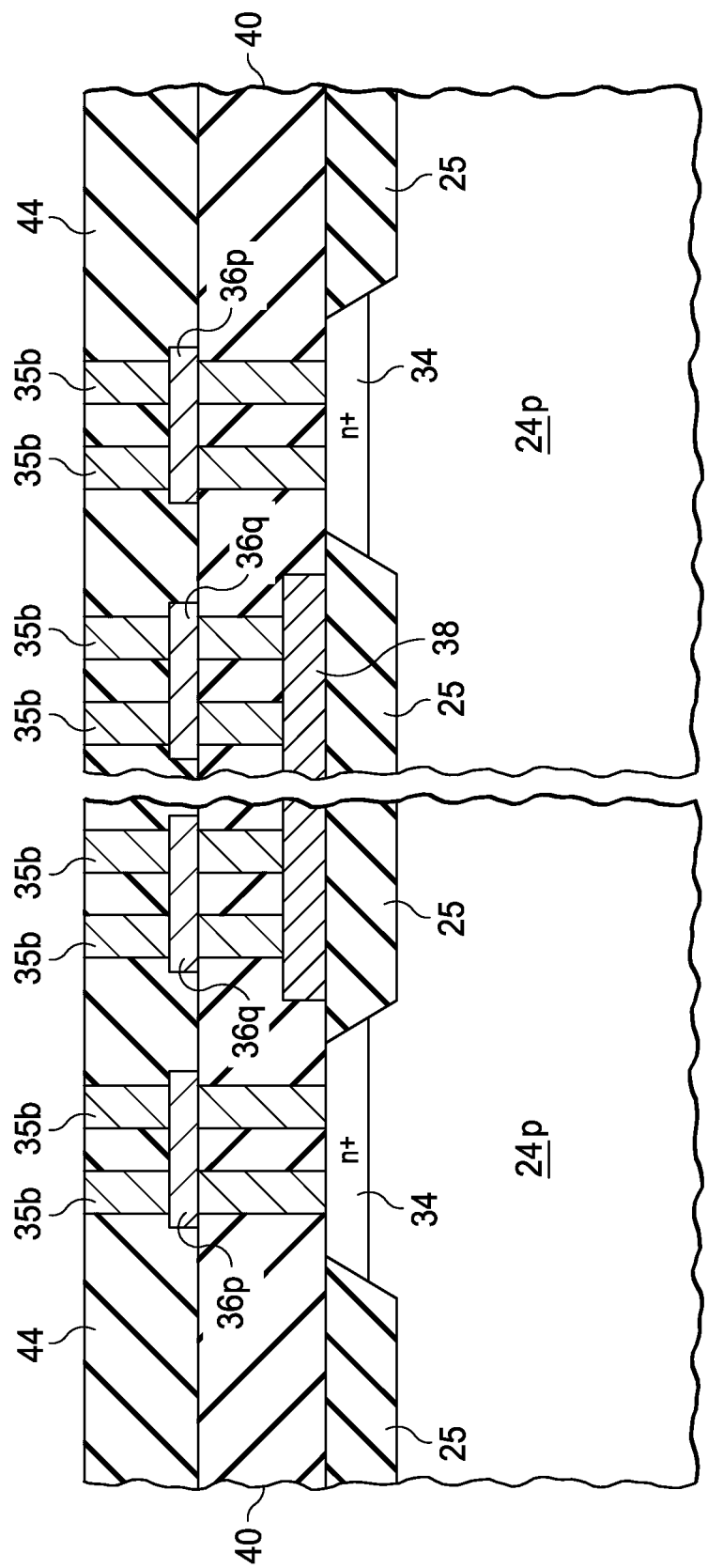
Figure 6H:
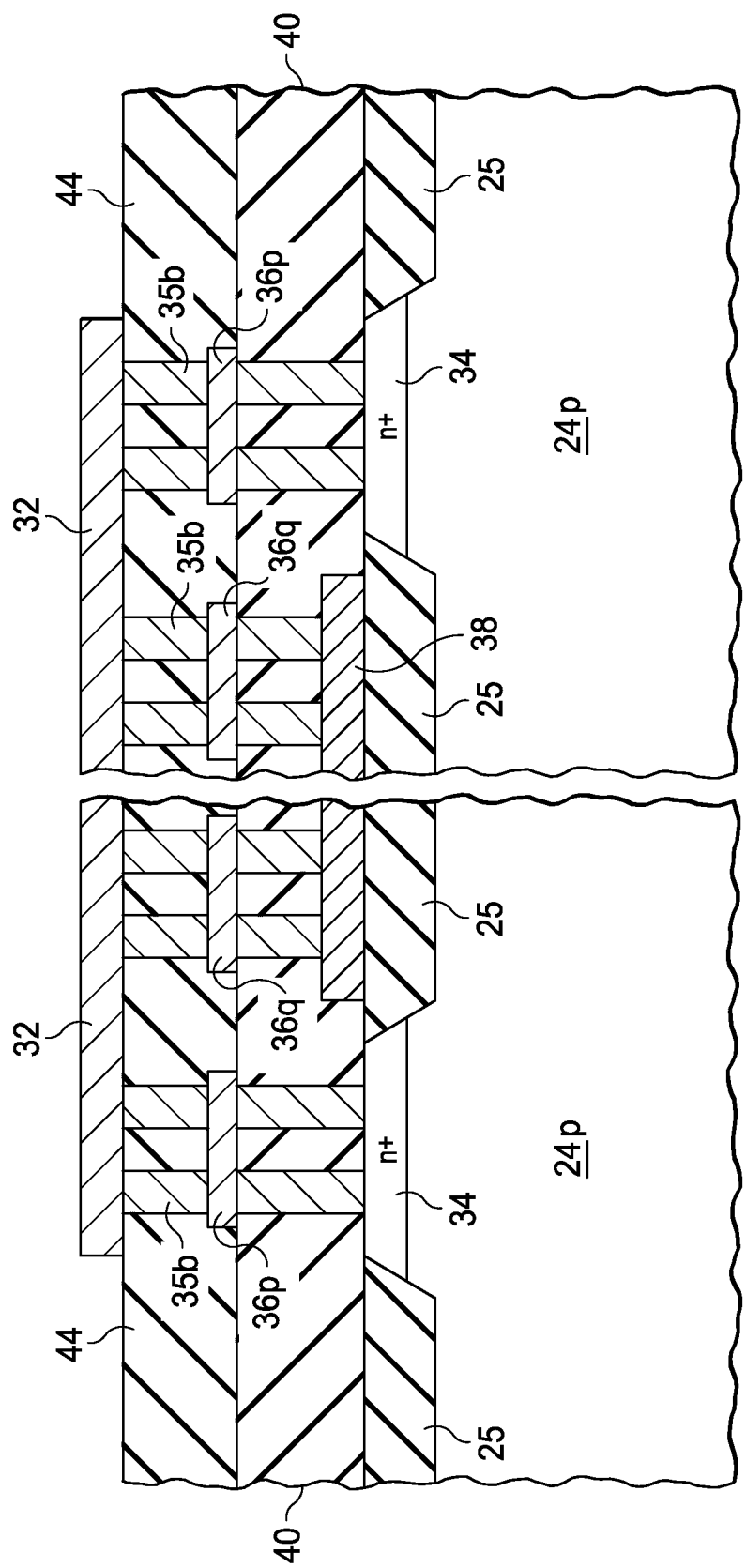

FIG. 6g illustrates the structure after formation of contact plugs 35b into contact openings 46. At this level, contact plugs 35b may be formed of tungsten, deposited by selective CVD or alternatively by way of CVD tungsten overall, or of aluminum, copper, and other suitable materials, as known in the art. Following formation of contact plugs 35b, the structure is planarized by way of CMP, resulting in the structure as shown in FIG. 6g. A second metal layer, of aluminum, copper, or other suitable metal, is then sputtered or otherwise deposited over planarized dielectric layer 44 including contact plugs 35b, and then patterned to define roof structure 32, as shown in FIG. 6h. Other metal conductors and elements in this second metal layer are also defined and formed in this process.

As known in the art, CMP planarization provides important benefits in the fabrication of modern integrated circuits. Planarization of the surface prior to formation of conductors in an upper metal level improves yield and reliability by eliminating topography of the underlying surface, such that step coverage is not a manufacturing issue, and so that thinning of metal conductors over steps does not present a reliability risk. The construction of shielding structure 30 according to embodiments of this invention enables the use of CMP planarization in modern non-volatile memories in which some memory cells require UV shielding, by way of its spaced apart contact posts 35, which both block UV light from reaching the protected memory cells but yet allowing subsequent CMP processing to be used without risk of dishing or undue particle contamination.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit formed at a surface of a semiconducting body, comprising:
    at least one non-volatile memory cell comprised of a floating-gate transistor at which trapped carriers define a stored data state, and from which trapped carriers release upon exposure to energy of an ultraviolet wavelength;
    a conductive element located near the surface and below the surface of the semiconducting body, disposed around the memory cell;
    a roof structure constructed of an opaque material, overlying the memory cell;
    a plurality of contact posts, constructed of a conductive opaque material, each in electrical contact with the conductive element, wherein each of the contact posts have a width ranging from about one-half of the ultraviolet wavelength to about two times the ultraviolet wavelength, and wherein adjacent ones of the contact posts are spaced apart from one another by a distance ranging from about one-half of the ultraviolet wavelength to about two times the ultraviolet wavelength.

2. The integrated circuit of claim 1, wherein the conductive element comprises:
    a diffused region at the surface, disposed around the memory cell;
    wherein the plurality of contact posts are each in electrical contact with the roof structure and with the diffused region.

3. The integrated circuit of claim 2, wherein the diffused region is disposed on a plurality of sides of the memory cell;
    and wherein the plurality of contact posts are disposed on each side of the memory cell.

4. The integrated circuit of claim 3, wherein the plurality of contact posts are arranged in at least two rows on each side of the memory cell, adjacent rows spaced apart from one another by a distance ranging from about one-half of the ultraviolet wavelength to about two times the ultraviolet wavelength.

5. The integrated circuit of claim 4, wherein the at least two rows of contact posts are staggered relative to one another.

6. The integrated circuit of claim 1, wherein the conductive element comprises:
    a polysilicon ring near the surface, disposed around the memory cell;
    wherein the plurality of contact posts are each in electrical contact with the roof element and with the polysilicon ring.

7. The integrated circuit of claim 6, wherein the polysilicon ring comprises at least four portions disposed on a plurality of sides of the memory cell;
    and wherein the plurality of contact posts are disposed on each side of the memory cell.

8. The integrated circuit of claim 7, wherein the plurality of contact posts are arranged in at least two rows on each side of the memory cell.

9. The integrated circuit of claim 8, wherein the at least two rows of contact posts are staggered relative to one another.

10. The integrated circuit of claim 1, wherein the conductive element comprises:
    a diffused region at the surface, disposed around the memory cell; and
    a conductive ring between the surface and the roof structure, and disposed around the memory cell interior to the diffused region;
    wherein a first group of the plurality of contact posts are each in electrical contact with the roof structure and with the diffused region;
    and wherein a second group of the plurality of contact posts are each in electrical contact with the roof structure and with the conductive ring.

11. The integrated circuit of claim 10, wherein the first group of the plurality of contact posts are arranged in at least two rows on each side of the memory cell.

12. The integrated circuit of claim 11, wherein the second group of the plurality of contact posts are arranged in at least two rows on each side of the memory cell.

13. The integrated circuit of claim 12, wherein the at least two rows of contact posts in the first and second groups of the plurality of contact posts are staggered relative to one another.

14. The integrated circuit of claim 1, further comprising:
    a metal conductor formed in a first metal layer, the metal conductor in contact with the memory cell, and comprising:
        a first portion extending in a first direction and crossing through an opening between contact posts along a side of the memory cell; and
        a second portion in contact with the first portion, extending substantially perpendicularly from opposite sides of the first portion to a length corresponding to the size of the opening, and disposed at a location between the memory cell and the plurality of contact posts.

15. The integrated circuit of claim 14
    wherein the roof structure is formed in a second metal layer overlying the first metal layer;
    and wherein the conductive element comprises:
        a diffused region at the surface, disposed around the memory cell;
        a polysilicon ring near the surface, disposed around the memory cell; and
        a plurality of metal elements in the first metal layer, overlying the diffused region and polysilicon ring;
    wherein a first group of the plurality of contact posts are each in electrical contact with the roof structure, with a metal element in the first metal layer, and with the diffused region;
    wherein a second group of the plurality of contact posts are each in electrical contact with the roof structure, with a metal element in the first metal layer, and with the polysilicon ring.

16. The integrated circuit of claim 15, wherein the first group of the plurality of contact posts are arranged in at least two rows on each side of the memory cell;
    and wherein the second group of the plurality of contact posts are arranged in at least two rows on each side of the memory cell.

17. The integrated circuit of claim 16, wherein the at least two rows of contact posts in the first and second groups of the plurality of contact posts are staggered relative to one another.

18. The integrated circuit of claim 1, further comprising:
    at least a second non-volatile memory cell comprised of a floating-gate transistor at which trapped carriers define a stored data state, and from which trapped carriers release upon exposure to energy of an ultraviolet wavelength;
    wherein the second memory cell is disposed outside of a region defined by the roof structure and the plurality of contact posts.

19. The integrated circuit of claim 4, wherein the at least two rows of contact posts are aligned with one another.

\* \* \* \* \*